United States Patent
Wada

(10) Patent No.: US 6,888,384 B2
(45) Date of Patent: May 3, 2005

(54) POWER-ON DETECTOR, AND POWER-ON RESET CIRCUIT USING THE SAME

(75) Inventor: Masaharu Wada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/601,623

(22) Filed: Jun. 24, 2003

(65) Prior Publication Data

US 2004/0189356 A1 Sep. 30, 2004

(30) Foreign Application Priority Data

Mar. 31, 2003 (JP) .................................... 2003-096691

(51) Int. Cl.[7] .............................................. H03K 17/22
(52) U.S. Cl. ..................................... 327/143; 327/198
(58) Field of Search ................................. 327/143, 198, 327/513, 539, 541, 543; 323/313, 314, 315, 907

(56) References Cited

U.S. PATENT DOCUMENTS

| | | | | |
|---|---|---|---|---|
| 5,898,323 A | * | 4/1999 | Suda ............................. | 327/66 |
| 6,011,447 A | * | 1/2000 | Iwasaki ......................... | 331/185 |
| 6,400,212 B1 | * | 6/2002 | Sakurai ......................... | 327/539 |
| 6,429,705 B1 | * | 8/2002 | Bando et al. .................. | 327/143 |
| 6,489,835 B1 | * | 12/2002 | Yu et al. ...................... | 327/539 |

FOREIGN PATENT DOCUMENTS

| | | |
|---|---|---|
| JP | 10-207580 | 8/1998 |
| JP | 2002-43917 | 2/2002 |

OTHER PUBLICATIONS

Hironori Banba, et al., "A CMOS Bandgap Reference Circuit with Sub–1–V Operation", IEEE Journal of Solid–State Circuits, vol. 34, No. 5, May 1999, pp. 670–674.

* cited by examiner

*Primary Examiner*—Timothy P. Callahan
*Assistant Examiner*—Terry L. Englund
(74) *Attorney, Agent, or Firm*—Oblon, Spivak, McClelland, Maier & Neustadt, P.C.

(57) ABSTRACT

A power-on detector includes a reference potential generation circuit which generates a reference potential, and a comparator which compares the first voltage generated on the basis of the reference potential output from the reference potential generation circuit and the potential of the first potential supply source, and the second voltage generated on the basis of the reference potential and the potential of the second potential supply source different from the potential of the first potential supply source. Power-on is detected when the potential difference between the potentials of the first and second potential supply sources upon power-on becomes larger than the sum of the first and second voltages.

17 Claims, 4 Drawing Sheets

POWER-ON DETECTOR, AND POWER-ON RESET CIRCUIT USING THE SAME

CROSS-REFERENCE TO RELATED APPLICATIONS

This application is based upon and claims the benefit of priority from the prior Japanese Patent Application No. 2003-096691, filed Mar. 31, 2003, the entire contents of which are incorporated herein by reference.

BACKGROUND OF THE INVENTION

1. Field of the Invention

The present invention relates to a power-on detector which detects power-on in a semiconductor integrated circuit device or the like, and a power-on reset circuit which initializes a register or latch circuit upon power-on.

2. Description of the Related Art

A conventional power-on detector is constituted by series-connecting a resistor and a diode or diode-connected transistor, and connecting the connection node to the input terminal of an inverter. The power-on detector generates a power-on detection signal by utilizing the fact that an output from the inverter is inverted as the power supply voltage rises upon power-on.

FIG. 1 is a circuit diagram showing an arrangement example of such conventional power-on detector. The source of a p-channel MOS transistor 11 is connected to a power supply $V_{DD}$, and the drain and gate are connected to one terminal of a resistor 12. The other terminal of the resistor 12 is connected to ground $V_{SS}$. The connection node between the drain of the MOS transistor 11 and one terminal of the resistor 12 is connected to the input terminal of a CMOS inverter 15 comprised of a p-channel MOS transistor 13 and n-channel MOS transistor 14. A power-on detection signal PDS is output from the output terminal of the CMOS inverter 15.

In this arrangement, when the semiconductor integrated circuit device is powered on, the potential of the power supply $V_{DD}$ increases. When the potential of the power supply $V_{DD}$ reaches a circuit operable level, the potential at the connection node between the diode-connected MOS transistor 11 and resistor 12 becomes higher than the circuit threshold voltage of the CMOS inverter 15. As a result, the output voltage (power-on detection signal PDS) of the CMOS inverter 15 changes to low level ("L" level). The potential of the power supply $V_{DD}$ further increases. When the potential at the connection node between the MOS transistor 11 and the resistor 12 becomes lower than the circuit threshold voltage of the CMOS inverter 15, the output voltage of the CMOS inverter 15 is inverted to high level ("H" level), and power-on is detected.

The power-on detection level can be controlled by adjusting the resistance value of the resistor 12 or the channel length/channel width ratio (L/W) of each of the MOS transistors 11, 13, and 14.

A technique of detecting power-on by the output signal PDS from the CMOS inverter 15 via a noise-cut low-pass filter (LPF) has also been known. The use of the low-pass filter can enhance noise resistance.

In the above-mentioned arrangement, however, the power-on detection level varies upon a change in temperature condition or variations in manufacturing process. This may result in a defective chip. For example, an onboard semiconductor integrated circuit device must normally operate within a wide temperature range of −40° C. to +125° C. A great change in temperature condition changes the threshold voltages of the MOS transistors 11, 13, and 14. The level at which the power-on detection signal PDS is inverted greatly varies. The resistor 12 is generally a diffused resistor. The resistance value of the diffused resistor readily varies upon variations in manufacturing process. Such variations cannot be fully coped with by adjusting the resistance value of the resistor 12 or the channel length/channel width ratio of each of the MOS transistors 11, 13, and 14.

When a semiconductor integrated circuit device incorporates a low-voltage circuit which operates around 1 V, the influence of a change in temperature difference or variations in manufacturing becomes more prominent. It becomes difficult to detect power-on.

To solve this problem, a technique of detecting power-on by using a circuit with low temperature dependency, such as a band gap reference circuit is proposed (see, e.g., Jpn. Pat. Appln KOKAI Publication Nos. 2002-43917 and H10-207580). However, no prior art can sufficiently reduce temperature dependency because an output voltage from the band gap reference circuit and a voltage prepared by resistance-dividing a power supply voltage are compared, in other words, a voltage free from temperature dependency and a voltage with temperature dependency (though temperature dependency is relatively low) are compared. Such technique is not satisfactorily applied to an onboard semiconductor integrated circuit device which is used under strict conditions.

The same problem occurs when a power-on reset circuit for initializing a register or latch circuit in a semiconductor integrated circuit device upon power-on is constituted using the above-described power-on detector. Demands have arisen for a measure against this problem.

BRIEF SUMMARY OF THE INVENTION

According to one aspect of the present invention, there is provided a power-on detector including a current generation circuit having a first output terminal and a second output terminal and configured to produce a first current and a second current from the first output terminal and the second output terminal, respectively, the first current and the second current having a low degree of temperature dependency and being substantially equal to each other, a first load element connected between the first output terminal of the current generation circuit and a first potential supply source, a current mirror circuit having a first current path and a second current path, the first current path being connected to the second output terminal of the current generation circuit, a second load element connected between the second current path of the current mirror circuit and a second potential supply source, and a first comparator having a first input terminal connected to the first output terminal of the current generation circuit, and a second input terminal connected to a connection node between the second load element and the current mirror circuit, the first comparator making comparison between (i) a first voltage obtained by causing the first current output from the first output terminal of the current generation circuit to flow to the first potential supply source by way of the first load element and (ii) a second voltage obtained by causing a current flowing from the second potential supply circuit to the second current oath of the current mirror circuit by way of the second load element, wherein power-on is detected when the second voltage becomes higher than the first voltage when a power supply is turned on.

According to another aspect of the present invention, there is provided a power-on reset circuit including a data holding circuit which holds data, a current generation circuit having a first output terminal and a second output terminal and configured to produce a first current and a second current from the first output terminal and the second output terminal, respectively, the first current and the second current having a low degree of temperature dependency and being substantially equal to each other, a first load element connected between the first output terminal of the current generation circuit and a first potential supply source, a current mirror circuit having a first current path and a second current path, the first current path being connected to the second output terminal of the current generation circuit, a second load element connected between the second current path of the current mirror circuit and a second potential supply source, a first comparator having a first input terminal connected to the first output terminal of the current generation circuit, and a second input terminal connected to a connection node between the second load element and the current mirror circuit, the first comparator making comparison between (i) a first voltage obtained by causing the first current output from the first output terminal of the current generation circuit to flow to the first potential supply source by way of the first load element and (ii) a second voltage obtained by causing a current flowing from the second potential supply circuit to the second current path of the current mirror circuit by way of the second load element, and a reset circuit which resets data held by the data holding circuit on the basis of an output signal from the first comparator, wherein the reset circuit resets data held by the data holding circuit when the second voltage becomes higher than the first voltage when a power supply is turned on."

DETAILED DESCRIPTION OF THE INVENTION

Figure 1:
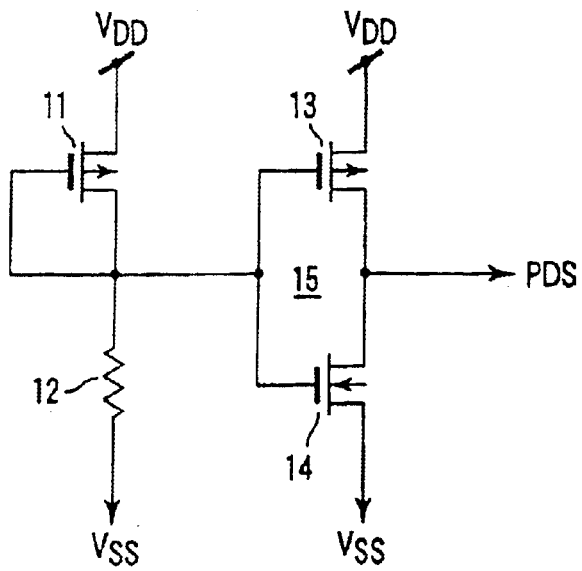
FIG. 1 is a circuit diagram showing a conventional power-on detector.
Figure 2:
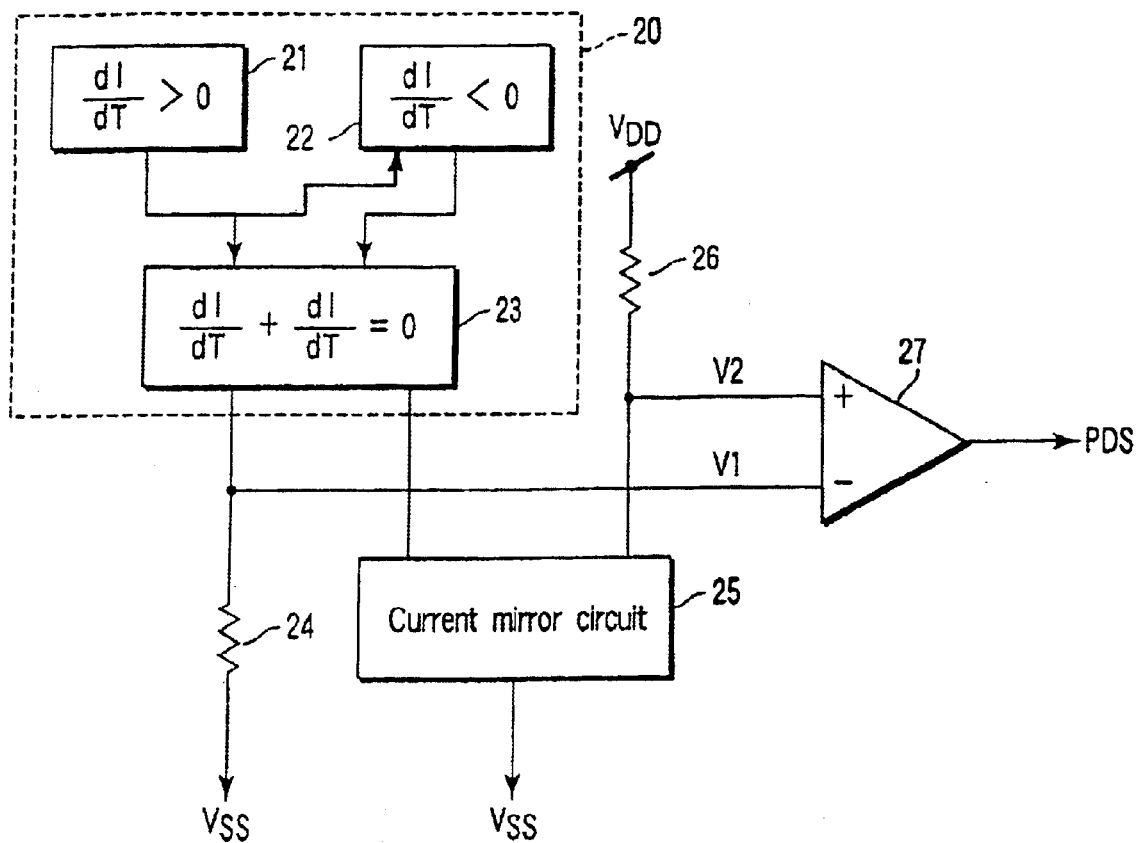
FIG. 2 is a conceptual view for explaining a power-on detector and power-on reset circuit according to the first embodiment of the present invention.

FIG. 2 is a conceptual view for explaining a power-on detector and power-on reset circuit according to the first embodiment of the present invention. A BGR (Band Gap Reference) circuit 20 is a reference potential generation circuit which generates a reference potential with low temperature dependency. The BGR circuit 20 is comprised of first, second, and third circuit units 21, 22, and 23. The circuit unit 21 is a circuit which generates a current (dI/dT>0) having a positive temperature characteristic. The circuit unit 22 is a circuit which generates a current (dI/dT<0) having a negative temperature characteristic. The output currents of the circuit units 21 and 22 are added by the circuit unit 23. As a result, the temperature characteristics of the circuit units 21 and 22 are canceled, and first and second output currents (dI/dT+dI/dT=0) substantially free from temperature dependency are generated.

The first output current of the circuit unit 23 is supplied to a resistor 24 to generate a voltage (first voltage) V1. The second output current is supplied to a current mirror circuit 25. The current mirror circuit 25 supplies a current equal to the output current to a resistor 26, generating a voltage (second voltage) V2. The voltage V1 becomes substantially free from the temperature characteristic with respect to the potential of ground $V_{SS}$ (potential of the first potential supply source). The voltage V2 becomes substantially free from the temperature characteristic with respect to the potential of a power supply $V_{DD}$ (potential of the second potential supply source).

The voltages V1 and V2 are compared by a comparator (first comparator) 27 to output a power-on detection signal PDS. When the sum of a voltage applied across the resistor 26 and a voltage applied across the resistor 24 exceeds the voltages of the power supplies $V_{DD}$ and $V_{SS}$, the comparator 27 changes the level of the power-on detection signal PDS from the potential of ground $V_{SS}$ to that of the power supply $V_{DD}$. The voltages across the resistors 24 and 26 are substantially free from temperature dependency, as described above. The potential to which an output (power-on detection signal PDS) from the comparator 27 changes is not influenced by any temperature change.

If the power-on detection signal PDS output from the comparator 27 is used to generate a reset signal for a data holding circuit such as a register or latch circuit, a power-on reset circuit free from any influence of a temperature change can be constituted.

Figure 3:
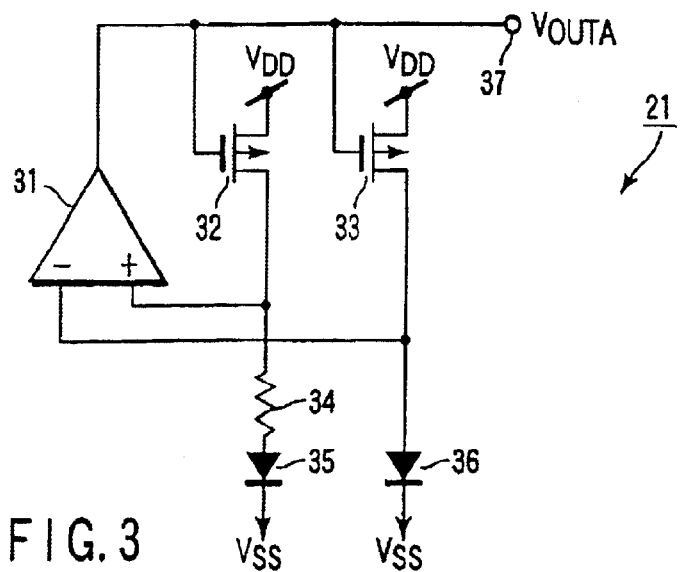
FIG. 3 is a circuit diagram showing an arrangement example of the first circuit unit in the circuit shown in FIG. 2.

FIG. 3 shows an arrangement example of the circuit unit 21 in the circuit shown in FIG. 2. This circuit comprises a differential amplifier (comparator) 31 for generating a positive temperature characteristic, p-channel MOS transistors 32 and 33, a resistor 34, and diodes 35 and 36. The source of the MOS transistor 32 is connected to the power supply $V_{DD}$; its drain, to the non-inverting input terminal (+) of the comparator 31; and its gate, to the output terminal of the comparator 31. The source of the MOS transistor 33 is connected to the power supply $V_{DD}$; its drain, to the inverting input terminal (−) of the comparator 31; and its gate, to the output terminal of the comparator 31. The drain of the MOS transistor 32 is connected to one terminal of the resistor 34. The anode-cathode path of the diode 35 is connected between the other terminal of the resistor 34 and ground $V_{SS}$. The drain of the MOS transistor 33 is connected to the anode of the diode 36, and the cathode of the diode 36 is connected to ground $V_{SS}$. The diode 35 is larger in size than the diode 36. A voltage $V_{OUTA}$ controlling a positive temperature characteristic current is output from an output terminal 37 connected to the output terminal of the comparator 31.

Figure 4:
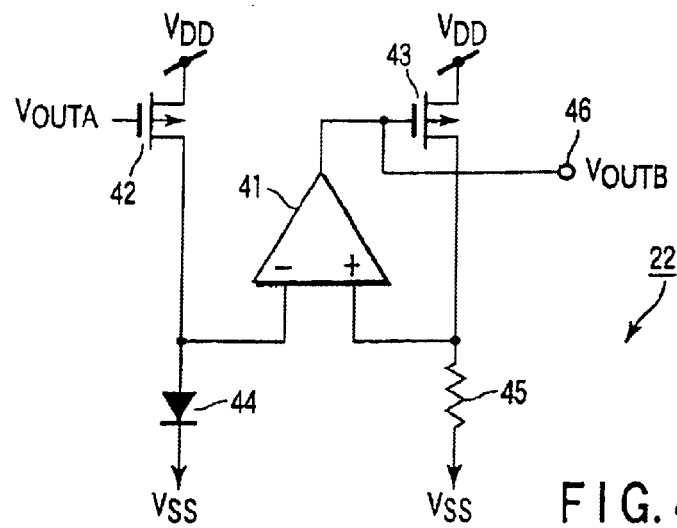
FIG. 4 is a circuit diagram showing an arrangement example of the second circuit unit in the circuit shown in FIG. 2.

FIG. 4 shows an arrangement example of the circuit unit 22 in the circuit shown in FIG. 2. This circuit comprises a differential amplifier (comparator) 41 for generating a negative temperature characteristic, p-channel MOS transistors 42 and 43, a diode 44, and a resistor 45. The source of the MOS transistor 42 is connected to the power supply $V_{DD}$; and its drain, to the inverting input terminal (−) of the comparator 41. The gate of the MOS transistor 42 receives the output voltage $V_{OUTA}$ of the circuit unit 21. The anode of the diode 44 is connected to the drain of the MOS transistor 42; and its cathode, to ground $V_{SS}$. The diode 44 is equal in size to the diode 36. The source of the MOS transistor 43 is connected to the power supply $V_{DD}$; its drain, to the non-inverting input terminal (+) of the comparator 41; and its gate, to the output terminal of the comparator 41. One terminal of the resistor 45 is connected to the drain of the MOS transistor 43; and the other terminal, to ground $V_{SS}$. A voltage $V_{OUTB}$ controlling a negative temperature characteristic current is output from an output terminal 46 connected to the output terminal of the comparator 41.

Figure 5:
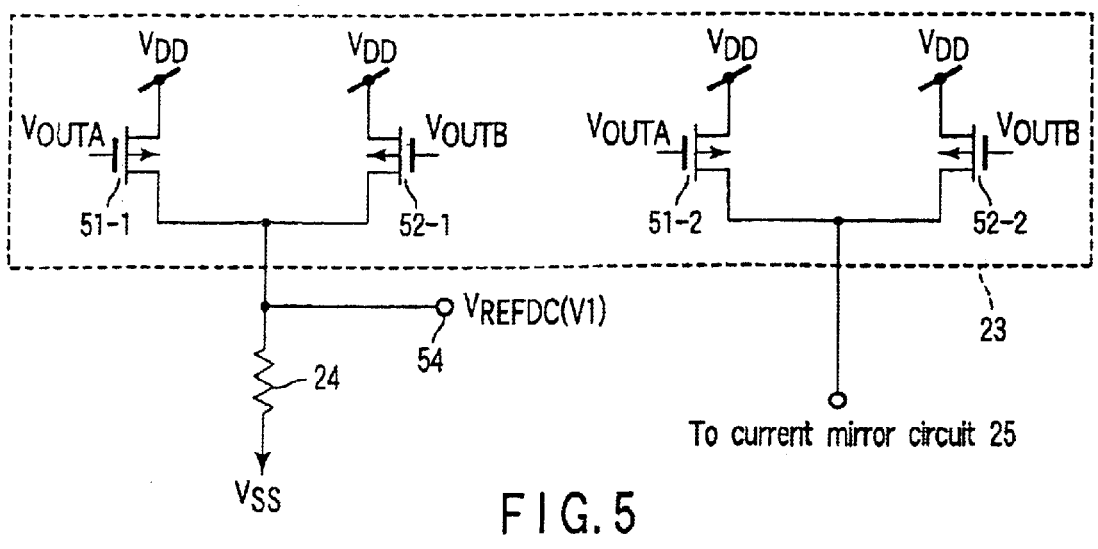
FIG. 5 is a circuit diagram showing an arrangement example of the third circuit unit in the circuit shown in FIG. 2.

FIG. 5 shows an arrangement example of the circuit unit 23 in the circuit shown in FIG. 2. This circuit comprises p-channel MOS transistors 51-1, 51-2, 52-1 and 52-2. The source of the MOS transistor 51-1 is connected to the power supply $V_{DD}$, and its gate receives the output voltage $V_{OUTA}$ of the circuit unit 21. The source of the MOS transistor 52-1 is connected to the power supply $V_{DD}$, its drain is commonly connected to the drain of the MOS transistor 51-1, and its gate receives the output voltage $V_{OUTB}$ of the circuit unit 22. The MOS transistors 51-1 and 52-1 operate as a first current source circuit which extracts a current free from any temperature characteristic from outputs from the differential amplifiers 31 and 41. The source of the MOS transistor 51-2 is connected to the power supply $V_{DD}$, and its sate receives the output voltage $V_{OUTA}$ of the circuit unit 21. The source of the MOS transistor 52-2 is connected to the power supply $V_{DD}$, its drain is commonly connected to the drain of the MOS transistor 51-2, and its gate receives the output voltage $V_{OUTB}$ of the circuit unit 22. The MOS transistors 51-2 and 52-2 operate as a second current source circuit which extracts a current free from any temperature characteristic from outputs from the differential amplifiers 31 and 41.

One terminal of the resistor 24 is connected to the common drain connection node between the MOS transistors 51-1 and 52-1; and the other terminal, to ground $V_{SS}$. A potential $V_{REFDC}$ (reference potential or first voltage V1) which is generated by adding the output currents of the circuit units 21 and 22 and is free from temperature dependency is output from an output terminal 54 connected to the common drain connection node between the MOS transistors 51-1 and 52-1.

The temperature dependency can be changed by adjusting the resistance values of the resistors 34 and 45. In this circuit, the resistance values are so adjusted as to reduce the temperature characteristic of the potential $V_{REFDC}$ (reference potential or first voltage V1).

The reference potential $V_{REFDC}$ can be set by the resistance value of the resistor 24. The reference potential $V_{REFDC}$ can be set high by increasing the resistance value of the resistor 24, and low by decreasing the resistance value. The use of a variable resistor 24 allows freely setting the reference potential $V_{REFDC}$.

Figure 6:
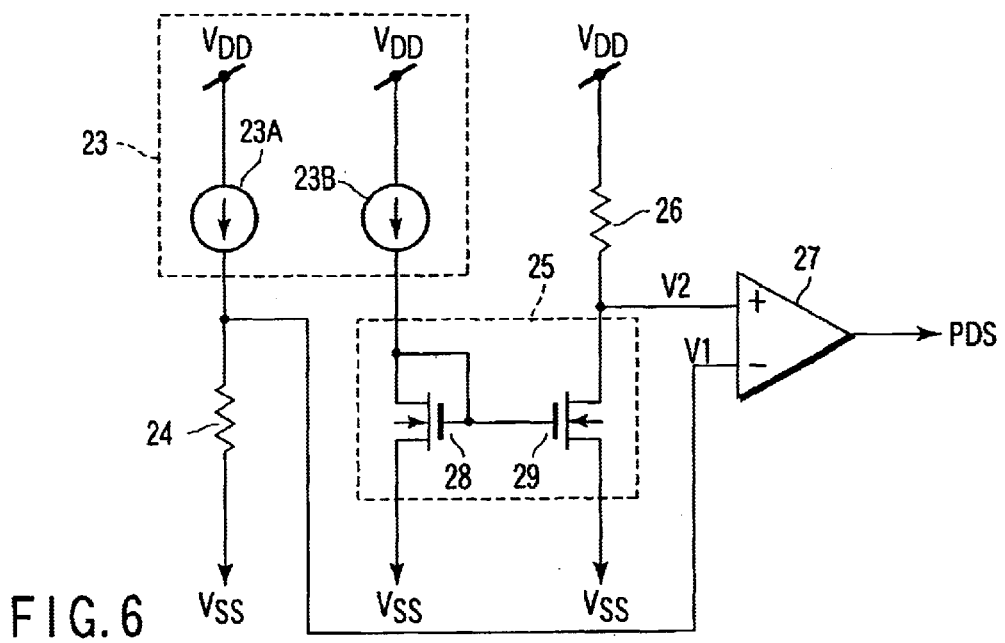
FIG. 6 is a circuit diagram showing a potential comparison circuit using a current source and current mirror circuit as an extracted part of the circuit shown in FIG. 2.

FIG. 6 shows an extracted part of the circuit shown in FIG. 2. This circuit is a potential comparison circuit using a current source and current mirror circuit. In FIG. 6, the same reference numerals as in FIG. 2 denote the same parts, and a detailed description thereof will be omitted.

The current mirror circuit 25 is comprised of n-channel MOS transistors 28 and 29. The drain and gate of the MOS transistor 28 are connected to the output terminal of the circuit unit 23 (which is equivalently illustrated by current sources 23A and 23B in FIG. 6), and the source is connected to ground $V_{SS}$. The drain of the MOS transistor 29 is connected to the other terminal of the resistor 26, its source is connected to ground $V_{SS}$, and its gate is commonly connected to the gate of the MOS transistor 28.

Figure 7:
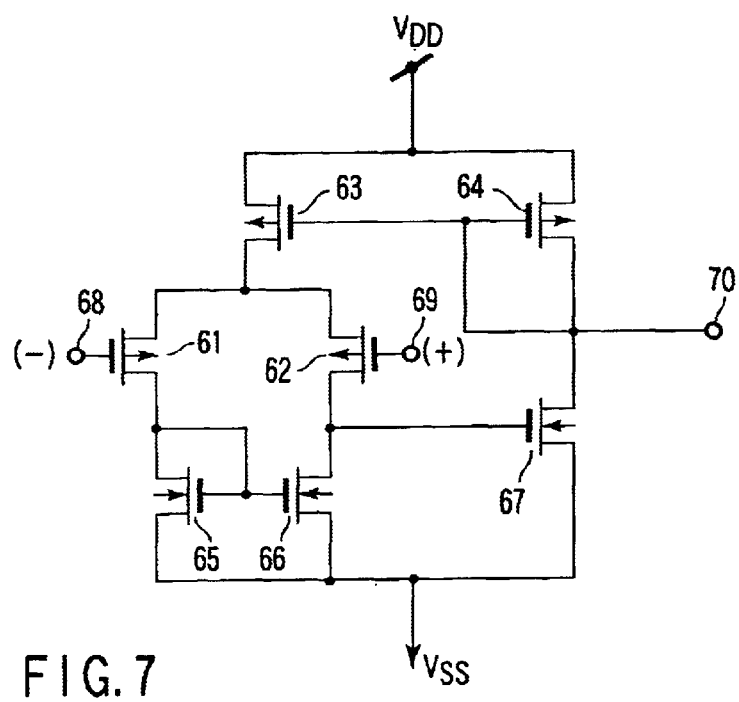
FIG. 7 is a circuit diagram showing an arrangement example of a comparator in the circuits shown in FIGS. 2, 3, 4, and 6.

FIG. 7 shows an arrangement example of the comparators (differential amplifiers) 27, 31, and 41 in the circuits shown in FIGS. 2, 3, 4, and 6. Each comparator is comprised of p-channel MOS transistors 61 to 64 and n-channel MOS transistors 65 to 67. The sources of the MOS transistors 61 and 62 which operate as a differential input pair are commonly connected, and their gates are respectively connected to differential input terminals 68 and 69 which operate as an inverting input terminal (−) and non-inverting input terminal (+). The drain-source path of the MOS transistor 63 is connected between the power supply $V_{DD}$ and the common source connection node between the MOS transistors 61 and 62. The drains of the MOS transistors 61 and 62 are commonly connected to those of the MOS transistors 65 and 66. The gates of the MOS transistors 65 and 66 are commonly connected to the drain of the MOS transistor 65; and their sources, to ground $V_{SS}$.

The source of the MOS transistor 64 is connected to the power supply $V_{DD}$, its drain is connected to an output terminal 70, and its gate is commonly connected to its drain and the gate of the MOS transistor 63. The drain of the MOS transistor 67 is connected to the output terminal 70; its source, to ground $V_{SS}$; and its gate, to the common drain connection node between the MOS transistors 62 and 66.

The comparator having this arrangement amplifies signals input to the differential input terminals 68 and 69 by the MOS transistors 61, 62, 65, and 66, and further amplifies the signals by the MOS transistors 63, 64, and 67. The comparator can operate even by a low-potential input signal.

Figure 8:
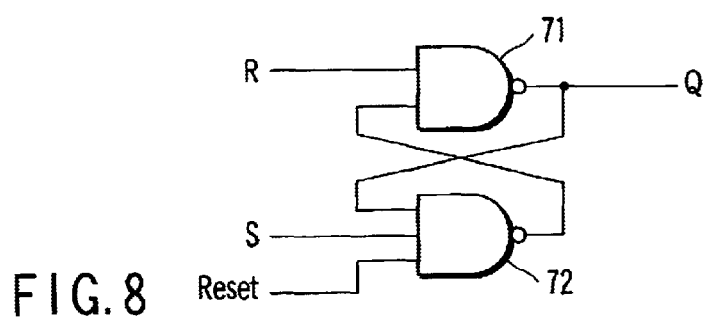
FIG. 8 is a circuit diagram showing a circuit, e.g., latch circuit which is reset by the detection signal of the power-on detector shown in FIGS. 2 to 7.

FIG. 8 shows a circuit, e.g., latch circuit which is reset by the power-on reset circuit shown in FIGS. 2 to 7. The latch circuit is a flip-flop comprised of a 2-input NAND gate 71 and 3-input NAND gate 72. The flip-flop latches data on the basis of signals input to a set terminal S and reset terminal R, and obtains an output signal Q. Upon power-on, the flip-flop receives the power-on detection signal PDS and is initialized.

Figure 9:
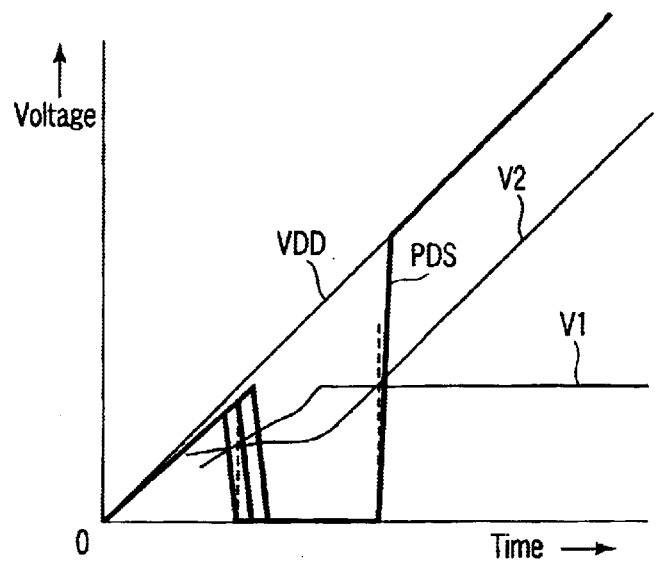
FIG. 9 is a waveform chart showing changes along the time axis in the potential of a power supply upon power-on, the level of a power-on detection signal, and a voltage input to the comparator.

FIG. 9 shows changes along the time axis in the potential of the power supply $V_{DD}$ upon power-on, the level of the power-on detection signal PDS, and the voltages V1 and V2. After power-on, the potential of the power supply $V_{DD}$ rises. On the initial stage of power-on, the voltage V2 is higher than V1. When the potential of the power supply $V_{DD}$ reaches a circuit operable level, the voltage V1 becomes higher than V2. Accordingly, the level of the power-on detection signal PDS which rises similarly to the potential of the power supply $V_{DD}$ is inverted from "H" level to "L" level. As the potential of the power supply $V_{DD}$ further rises, the voltage V2 becomes higher than V1. The power-on detection signal PDS output from the comparator 27 is inverted to "H" level, and power-on is detected.

In this arrangement, the BGR circuit 20 is used to generate the voltages V1 and V2 free from temperature dependency. The voltages V1 and V2 are compared to generate the power-on detection signal PDS. The temperature dependency can be substantially eliminated. The circuit is constituted using a pair of MOS transistors, eliminating the influence of process variations. By controlling the resistance value of the resistor 53, the power-on detection level can be freely adjusted.

Figure 10:
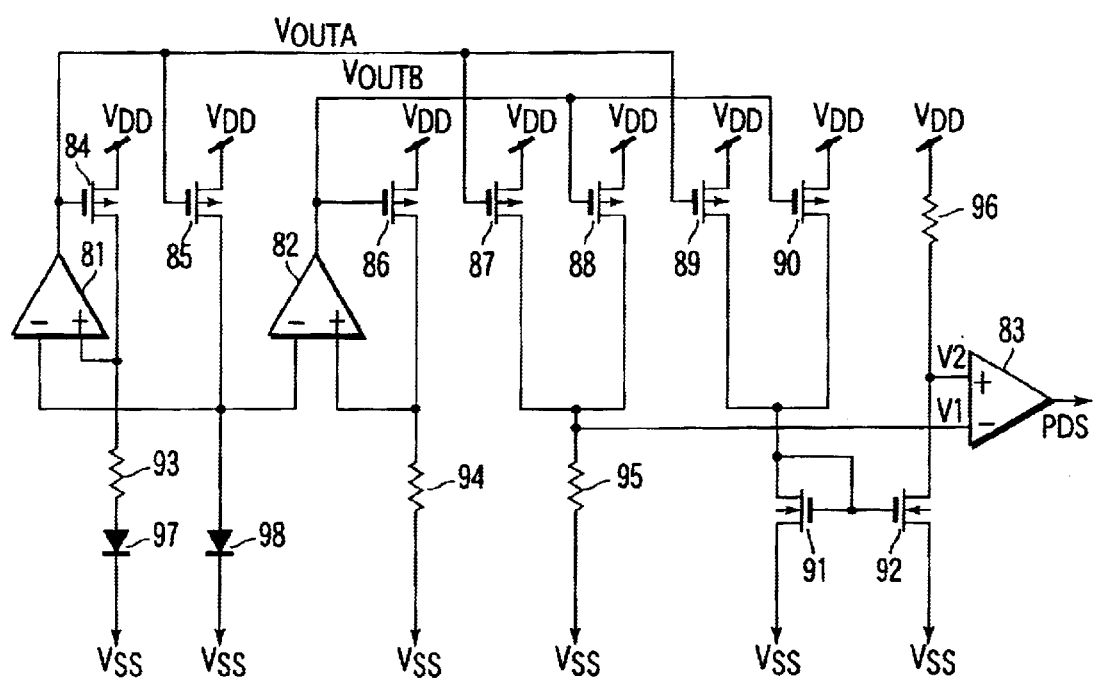
FIG. 10 is a circuit diagram for explaining a power-on detector and power-on reset circuit according to the second embodiment of the present invention.

FIG. 10 is a circuit diagram for explaining a power-on detector and power-on reset circuit according to the second embodiment of the present invention. This circuit comprises comparators 81 to 83, p-channel MOS transistors 84 to 90, n-channel MOS transistors 91 and 92, resistors 93 to 96, and diodes 97 and 98.

The source of the MOS transistor 84 is connected to a power supply $V_{DD}$; its drain, to the non-inverting input terminal (+) of the comparator 81; and its gate, to the output terminal of the comparator 81. One terminal of the resistor 93 is connected to the drain of the MOS transistor 84; and the other terminal, to the anode of the diode 97. The cathode of the diode 97 is connected to ground $V_{SS}$. The source of the MOS transistor 85 is connected to the power supply $V_{DD}$; its drain, to the inverting input terminals (−) of the comparators 81 and 82; and its gate, to the output terminal of the comparator 81. The anode of the diode 98 is connected to the drain of the MOS transistor 85; and its cathode, to ground $V_{SS}$.

The source of the MOS transistor 86 is connected to the power supply $V_{DD}$; its drain, to the non-inverting input terminal (+) of the comparator 82; and its gate, to the output terminal of the comparator 82. One terminal of the resistor 94 is connected to the drain of the MOS transistor 86; and the other terminal, to ground $V_{SS}$.

The source of the MOS transistor 87 is connected to the power supply $V_{DD}$; and its gate, to the output terminal of the comparator 81. The source of the MOS transistor 88 is connected to the power supply $V_{DD}$, its drain is commonly connected to the drain of the MOS transistor 87, and its gate is connected to the output terminal of the comparator 82. The resistor 95 is connected between ground $V_{SS}$ and the common drain connection node between the MOS transistors 87 and 88. The common drain connection node is connected to the inverting input terminal (−) of the comparator 83.

The source of the MOS transistor 89 is connected to the power supply $V_{DD}$; and its gate, to the output terminal of the comparator 81. The source of the MOS transistor 90 is connected to the power supply $V_{DD}$, its drain is commonly connected to the drain of the MOS transistor 89, and its gate is connected to the output terminal of the comparator 82. The drain and gate of the MOS transistor 91 are connected to the common drain connection node between the MOS transistors 89 and 90. The source of the MOS transistor 91 is connected to ground $V_{SS}$.

One terminal of the resistor 96 is connected to the power supply $V_{DD}$; and the other terminal, to the drain of the MOS transistor 92 and the non-inverting input terminal (+) of the comparator 83. The source of the MOS transistor 92 is connected to ground $V_{SS}$; and its gate, to the gate of the MOS transistor 91. A power-on detection signal is output from the output terminal of the comparator 83.

The comparators 81 to 83 can reliably operate even at a low voltage around 1 V with the same arrangement as that of the circuit shown in FIG. 7.

In this arrangement, the basic arrangement and operation are the same as those in the first embodiment. More specifically, a BGR circuit is used to generate voltages V1 and V2 free from temperature dependency. The voltages V1 and V2 are compared to generate the power-on detection signal PDS. The temperature dependency can be substantially eliminated. By controlling the resistance value of the resistor 95 and 96 the power-on detection level can be freely adjusted.

In the second embodiment, the MOS transistor 85 and diode 98 are shared between the comparators 81 and 82. The output voltages $V_{OUTA}$ and $V_{OUTB}$ of the comparators 81 and 82 are respectively received by a pair of MOS transistors 87 and 88 and a pair of MOS transistors 89 and 90. This can further reduce variations in manufacturing process.

The power-on detector having the above arrangement, and the power-on reset circuit using the power-on detector can suppress variations in power-on detection level caused by a temperature change or manufacturing variations, and can perform reliable detection operation or reset operation even at a low voltage.

In the power-on detector and power-on reset circuit according to the first and second embodiments, the conductivity types of each p-channel MOS transistor and each n-channel MOS transistor can be reversed, and the polarities of the power supplies $V_{DD}$ and $V_{SS}$ can be reversed.

As described above, according to one aspect of this invention, a power-on detector capable of suppressing variations in power-on detection level caused by a temperature change or manufacturing variations, and performing reliable detection operation even at a low voltage, and a power-on reset circuit using the power-on detector can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A power-on detector comprising:
   a current generation circuit having a first output terminal and a second output terminal and configured to produce a first current and a second current from the first output terminal and the second output terminal, respectively, the first current and the second current having a low degree of temperature dependency and being substantially equal to each other;
   a first load element connected between the first output terminal of the current generation circuit and a first potential supply source;
   a current mirror circuit having a first current path and a second current path, the first current path being connected to the second output terminal of the current generation circuit;
   a second load element connected between the second current path of the current mirror circuit and a second potential supply source; and
   a first comparator having a first input terminal connected to the first output terminal of the current generation circuit, and a second input terminal connected to a connection node between the second load element and the current mirror circuit, the first comparator making a comparison between (i) a first voltage obtained by causing the first current output from the first output terminal of the current generation circuit to flow to the first potential supply source by way of the first load element, and (ii) a second voltage obtained by causing a current flowing from the second potential supply circuit to the second current path of the current mirror circuit by way of the second load element, wherein power-on is detected when the second voltage becomes higher than the first voltage when a power supply is turned on.

2. The detector according to claim 1, wherein the current generation circuit includes a band gap reference circuit.

3. The detector according to claim 2, wherein the band gap reference circuit comprises:

a first circuit unit which is so constituted as to generate a third current having a positive temperature characteristic, a second circuit unit which is so constituted as to generate a fourth current having a negative temperature characteristic, and a third circuit unit which is so constituted as to add the third current output from the first circuit unit and the fourth current output from the second circuit unit and to generate the first current and the second current on the basis of the added currents.

4. The detector according to claim 3, wherein the first circuit unit comprises:

a second comparator, a first MOS transistor of a first conductivity type which has one end of a current path connected to the second potential supply source, the other end of the current path connected to a non-inverting input terminal of the second comparator, and a gate connected to an output terminal of the second comparator, a second MOS transistor of the first conductivity type which has one end of a current path connected to the second potential supply source, the other end of the current path connected to an inverting input terminal of the second comparator, and a gate connected to the output terminal of the second comparator, a first resistor which has one terminal connected to said other end of the current path of the first MOS transistor, a first diode which has an anode connected to the other terminal of the first resistor and a cathode connected to the first potential supply source, and a second diode which has an anode connected to said other end of the current path of the second MOS transistor and a cathode connected to the first potential supply source, and the first circuit unit obtains an output signal from the output terminal of the second comparator.

5. The detector according to claim 4, wherein the second circuit unit comprises:

a third comparator, a third MOS transistor of the first conductivity type which has one end of a current path connected to the second potential supply source and the other end of the current path connected to an inverting input terminal of the third comparator and receives at a gate the output signal from the first circuit unit, a fourth MOS transistor of the first conductivity type which has one end of a current path connected to the second potential supply source, the other end of the current path connected to a non-inverting input terminal of the third comparator, and a gate connected to an output terminal of the third comparator, a third diode which has an anode connected to said other end of the current path of the third MOS transistor and a cathode connected to the first potential supply source, and a second resistor which has one terminal connected to said other end of the current path of the fourth MOS transistor and the other terminal connected to the first potential supply source, and the second circuit unit obtains an output signal from the output terminal of the third comparator.

6. The detector according to claim 5, wherein the third circuit unit comprises:

a fifth MOS transistor of the first conductivity type which has one end of a current path connected to the second potential supply source and the other end of the current path connected to the first output terminal and receives at a gate the output signal from the first circuit unit, a sixth MOS transistor of the first conductivity type which has one end of a current path connected to the second potential supply source and the other end of the current path connected to the first output terminal and receives at a gate the output signal from the second circuit unit, a seventh MOS transistor of the first conductivity type which has one end of a current path connected to the second potential supply source and the other end of the current path connected to the second output terminal and receives at a gate the output signal from the first circuit unit, and an eighth MOS transistor of the first conductivity type which has one end of a current path connected to the second potential supply source and the other end of the current path connected to the second output terminal and receives at a gate the output signal from the second circuit unit.

7. The detector according to claim 1, wherein the current mirror circuit comprises:

a first MOS transistor of a first conductivity type which has one end of a current path and a gate connected to the second output terminal of the current generation circuit and the other end of the current path connected to the first potential supply source, and a second MOS transistor of the first conductivity type which has one end of a current path connected to the second load element, the other end of the current path connected to the first potential supply source, and a gate commonly connected to the gate of the first MOS transistor.

8. The detector according to claim 1, wherein the first comparator comprises:

a first MOS transistor of a first conductivity type which has a gate connected to the first input terminal, a second MOS transistor of the first conductivity type which has one end of a current path commonly connected to one end of a current path of the first MOS transistor and a gate connected to the second input terminal, a third MOS transistor of the first conductivity type which has one end of a current path connected to said one end of each of the current paths of the first and second MOS transistors and the other end of the current path connected to the second potential supply source, a fourth MOS transistor of a second conductivity type which has one end of a current path and a gate connected to the other end of the current path of the first MOS transistor and the other end of the current path connected to the first potential supply source, a fifth MOS transistor of the second conductivity type which has one end of a current path connected to the other end of the current path of the second MOS transistor, the other end of the current path connected to the first potential supply source, and a gate commonly connected to the gate of the fourth MOS transistor, a sixth MOS transistor of the first conductivity type which has one end of a current path connected to the second potential supply source, the other end of the current path connected to an output terminal of the first comparator and a gate commonly connected to a gate of the third MOS transistor, and a seventh MOS transistor of the second conductivity type which has one end of a current path connected to the output terminal of the first comparator, the other end of the current path connected to the first potential supply source, and a gate connected to a connection node between the current paths of the second and fifth MOS transistors.

9. A power-on reset circuit comprising:

a data holding circuit which holds data;

a current generation circuit having a first output terminal and a second output terminal and configured to produce a first current and a second current from the first output terminal and the second output terminal, respectively, the first current and the second current having a low degree of temperature dependency and being substantially equal to each other;

a first load element connected between the first output terminal of the current generation circuit and a first potential supply source;

a current mirror circuit having a first current path and a second current path, the first current path being connected to the second output terminal of the current generation circuit;

a second load element connected between the second current path of the current mirror circuit and a second potential supply source;

a first comparator having a first input terminal connected to the first output terminal of the current generation circuit, and a second input terminal connected to a connection node between the second load element and the current mirror circuit, the first comparator making a comparison between (i) a first voltage obtained by causing the first current output from the first output terminal of the current generation circuit to flow to the first potential supply source by way of the first load element, and (ii) a second voltage obtained by causing a current flowing from the second potential supply circuit to the second current path of the current mirror circuit by way of the second load element; and a reset circuit which resets the data held by the data holding circuit on the basis of an output signal from the first comparator, wherein the reset circuit resets the data held by the data holding circuit when the second voltage becomes higher than the first voltage when a power supply is turned on.

10. The circuit according to claim 9, wherein the data holding circuit includes at least one of a register and a latch circuit.

11. The circuit according to claim 9, wherein the current generation circuit includes a band gap reference circuit.

12. The circuit according to claim 11, wherein the band gap reference circuit comprises:

a first circuit unit which is so constituted as to generate a third current having a positive temperature characteristic, a second circuit unit which is so constituted as to generate a fourth current having a negative temperature characteristic, and a third circuit unit which is so constituted as to add the third current output from the first circuit unit and the fourth current output from the second circuit unit and to generate the first current and the second current on the basis of the added currents.

13. The circuit according to claim 12, wherein the first circuit unit comprises:

a second comparator, a first MOS transistor of a first conductivity type which has one end of a current path connected to the second potential supply source, the other end of the current path connected to a non-inverting input terminal of the second comparator, and a gate connected to an output terminal of the second comparator, a second MOS transistor of the first conductivity type which has one end of a current path connected to the second potential supply source, the other end of the current path connected to an inverting input terminal of the second comparator, and a gate connected to the output terminal of the second comparator, a first resistor which has one terminal connected to said other end of the current path of the first MOS transistor, a first diode which has an anode connected to the other terminal of the first resistor and a cathode connected to the first potential supply source, and a second diode which has an anode connected to said other end of the current path of the second MOS transistor and a cathode connected to the first potential supply source, and the first circuit unit obtains an output signal from the output terminal of the second comparator.

14. The circuit according to claim 13, wherein the second circuit unit comprises:

a third comparator, a third MOS transistor of the first conductivity type which has one end of a current path connected to the second potential supply source and the other end of the current path connected to an inverting input terminal of the third comparator and receives at a gate the output signal from the first circuit unit, a fourth MOS transistor of the first conductivity type which has one end of a current path connected to the second potential supply source, the other end of the current path connected to a non-inverting input terminal of the third comparator, and a gate connected to an output terminal of the third comparator, a third diode which has an anode connected to said other end of the current path of the third MOS transistor and a cathode connected to the first potential supply source, and a second resistor which has one terminal connected to said other end of the current path of the fourth MOS transistor and the other terminal connected to the first potential supply source, and the second circuit unit obtains an output signal from the output terminal of the third comparator.

15. The circuit according to claim 14, wherein the third circuit unit comprises:

a fifth MOS transistor of the first conductivity type which has one end of a current path connected to the second potential supply source and the other end of the current path connected to the first output terminal and receives at a gate the output signal from the first circuit unit, a sixth MOS transistor of the first conductivity type which has one end of a current path connected to the second potential supply source and the other end of the current path connected to the first output terminal and receives at a gate the output signal from the second circuit unit, a seventh MOS transistor of the first conductivity type which has one end of a current path connected to the second potential supply source and the other end of the current path connected to the second output terminal and receives at a gate the output signal from the first circuit unit, and an eighth MOS transistor of the first conductivity type which has one end of a current path connected to the second potential supply source and the other end of the current path connected to the second output terminal and receives at a sate the output signal from the second circuit unit.

16. The circuit according to claim 9, wherein the current mirror circuit comprises:

a first MOS transistor of a first conductivity type which has one end of a current path and a gate connected to the second output terminal of the current generation circuit and the other end of the current path connected to the first potential supply source, and a second MOS transistor of the first conductivity type which has one end of a current path connected to the second load element, the other end of the current path connected to the first potential supply source, and a gate commonly connected to the gate of the first MOS transistor.

17. The circuit according to claim 9, wherein the first comparator comprises:

a first MOS transistor of a first conductivity type which has a gate connected to the first input terminal, a second MOS transistor of the first conductivity type which has one end of a current path commonly connected to one end of a current path of the first MOS transistor and a gate connected to the second input terminal, a third MOS transistor of the first conductivity type which has one end of a current path connected to said one end of each of the current paths of the first and second MOS transistors and the other end of the current path connected to the second potential supply source, a fourth MOS transistor of a second conductivity type which has one end of a current path and a gate connected to the other end of the current path of the first MOS transistor and the other end of the current path connected to the first potential supply source, a fifth MOS transistor of the second conductivity type which has one end of a current path connected to the other end of the current path of the second MOS transistor, the other end of the current path connected to the first potential supply source, and a gate commonly connected to the gate of the fourth MOS transistor, a sixth MOS transistor of the first conductivity type which has one end of a current path connected to the second potential supply source, the other end of the current path connected to an output terminal of the first comparator, and a gate commonly connected to a gate of the third MOS transistor, and a seventh MOS transistor of the second conductivity type which has one end of a current path connected to the output terminal of the first comparator, the other end of the current path connected to the first potential supply source, and a gate to a connection node between the current paths of the second and fifth MOS transistors.

* * * * *